US008741749B2

(12) United States Patent
Lappalainen et al.

(10) Patent No.: US 8,741,749 B2
(45) Date of Patent: Jun. 3, 2014

(54) SEMICONDUCTOR AND AN ARRANGEMENT AND A METHOD FOR PRODUCING A SEMICONDUCTOR

(75) Inventors: Reijo Lappalainen, Hiltulanlahti (FI); Vesa Myllymäki, Helsinki (FI); Lasse Pulli, Helsinki (FI); Jari Ruuttu, Billnäs (FI); Juha Mäkitalo, Tammisaari (FI)

(73) Assignee: Picodeon Ltd Oy, Helsinki (FI)

( * ) Notice: Subject to any disclaimer, the term of this patent is extended or adjusted under 35 U.S.C. 154(b) by 645 days.

(21) Appl. No.: 12/280,657

(22) PCT Filed: Feb. 23, 2007

(86) PCT No.: PCT/FI2007/050108
§ 371 (c)(1),
(2), (4) Date: Aug. 25, 2008

(87) PCT Pub. No.: WO2007/096487
PCT Pub. Date: Aug. 30, 2007

(65) Prior Publication Data
US 2009/0166812 A1    Jul. 2, 2009

(30) Foreign Application Priority Data

Feb. 23, 2006  (FI) .................................. 20060177
Feb. 23, 2006  (FI) .................................. 20060178
Feb. 23, 2006  (FI) .................................. 20060181
Feb. 23, 2006  (FI) .................................. 20060182
Apr. 12, 2006  (FI) .................................. 20060357

(51) Int. Cl.
*H01L 29/06*    (2006.01)
(52) U.S. Cl.
USPC ............................ 438/487; 438/662; 438/940

(58) Field of Classification Search
USPC .................. 257/626, 631; 438/487, 662, 940
See application file for complete search history.

(56) References Cited

U.S. PATENT DOCUMENTS

| | | | |
|---|---|---|---|
| 5,415,901 A * | 5/1995 | Tanaka et al. | 427/596 |
| 5,478,650 A | 12/1995 | Davanloo et al. | |
| 6,090,207 A | 7/2000 | Knauss et al. | |
| 6,110,291 A * | 8/2000 | Haruta et al. | 118/726 |
| 6,472,295 B1 * | 10/2002 | Morris et al. | 438/463 |
| 7,115,514 B2 * | 10/2006 | Stoltz | 438/690 |
| 7,338,913 B2 * | 3/2008 | Kasahara et al. | 438/795 |
| 7,351,241 B2 * | 4/2008 | Bendett et al. | 606/3 |
| 7,386,019 B2 * | 6/2008 | Klimov et al. | 372/18 |

(Continued)

FOREIGN PATENT DOCUMENTS

| | | |
|---|---|---|
| DE | 10343080 | 4/2005 |
| WO | 9117282 | 11/1991 |

OTHER PUBLICATIONS

International search report in corresponding PCT/FI2007050108.

*Primary Examiner* — Eugene Lee
(74) *Attorney, Agent, or Firm* — Young & Thompson (57) ABSTRACT

The present invention relates generally to semiconductors, material layers within semiconductors, a production method of semiconductors, and a manufacturing arrangement for producing semiconductors. A semiconductor according to the invention includes at least one layer with a surface, produced by laser ablation, wherein the uniform surface area to be produced includes at least an area 0.2 dm$^2$ and the layer has been produced by employing ultra short pulsed laser deposition wherein pulsed laser beam is scanned with a rotating optical scanner including at least one mirror for reflecting the laser beam.

15 Claims, 7 Drawing Sheets

(56) References Cited

U.S. PATENT DOCUMENTS

| | | | |
|---|---|---|---|
| 7,482,551 B2* | 1/2009 | Sun et al. | 219/121.6 |
| 7,582,848 B2* | 9/2009 | Smart | 219/121.69 |
| 7,642,205 B2* | 1/2010 | Timans | 438/795 |
| 7,795,154 B2* | 9/2010 | Tanaka et al. | 438/738 |
| 2001/0003697 A1* | 6/2001 | Jennings et al. | 451/36 |
| 2002/0197493 A1 | 12/2002 | Yamada et al. | |
| 2003/0166308 A1 | 9/2003 | Nakamura et al. | |
| 2005/0005846 A1 | 1/2005 | Selvamanickam et al. | |
| 2005/0036190 A1 | 2/2005 | Tanaka | |
| 2005/0106507 A1* | 5/2005 | Bernds et al. | 430/322 |
| 2006/0088984 A1* | 4/2006 | Li et al. | 438/463 |

* cited by examiner

FIG. 10c y = 50 -200 nm, for example 100 nm x = 1 µm - 1000 µm, for example 45 µm

SEMICONDUCTOR AND AN ARRANGEMENT AND A METHOD FOR PRODUCING A SEMICONDUCTOR

FIELD OF INVENTION

The present invention relates generally to semiconductors, material layers relating to semiconductors and integrated circuits, a production method of semiconductors, and a manufacturing arrangement for producing semiconductors. More specifically, the present invention relates to what is disclosed in the preamble of the independent claims.

BACKGROUND

Semiconductors are used in most electronic appliances. The conventional use of semiconductors has included providing electrical components for printed circuit boards including e.g. transistors and integrated circuits such as memories and processors. The semiconductors are usually manufactured on a silicon substrate. Other semiconducting, conductive and isolating materials, possibly also optical materials are produced on the silicon substrate, and functional semiconductor circuits/components are made by patterning and wiring the layers.

However, new kinds of needs have evolved for semiconductors. Electronic flat displays and other modern user interfaces require large-sized circuits which should be light in weight and robust for everyday handling. The semiconductor circuits which are based on silicon substrates are, however too costly for large-sized applications, and they are not as robust as required.

It has been suggested to produce semiconductor circuitry by using other, low-cost materials as a substrate and providing semiconducting materials as thin film layers. The substrate could be e.g. glass or plastic, or even fiber materials. This kind of technology would allow large-sized semiconductor circuits which have less weight and are not as sensitive to mechanical stresses. It would also be possible to use other semiconducting materials which have special properties. However, with the present technologies it has not been possible to produce material layers of sufficiently high quality, in large sizes and in industrial volumes. Also, the non-homogeneity of semiconducting layers causes non-ideal performance of the semiconductors.

The applicant has investigated possibilities for using laser cold ablation in production of semiconductors. In the recent years, considerable development of the laser technology has provided means to produce very high-efficiency laser systems that are based on semi-conductor fibres, thus supporting advance in so called cold ablation methods. Cold ablation is based on forming high energy laser pulses of short duration, such as within picosecond range, and directing the pulses into the surface of a target material. A plume of plasma is thus ablated from the area where the laser beam hits the target. The applications of cold ablation include e.g. coating and machining.

When employing novel cold-ablation, both qualitative and production rate related problems associated with coating, thin film production as well as cutting/grooving/carving etc. has been approached by focusing on increasing laser power and reducing the spot size of the laser beam on the target. However, most of the power increase was consumed to noise. The qualitative and production rate related problems were still remaining although some laser manufacturers resolved the laser power related problem. Representative samples for both coating/thin film as well as cutting/grooving/carving etc. could be produced only with low with repetition rates, narrow scanning widths and with long working time beyond industrial feasibility as such, highlighted especially for large bodies.

Because the energy content of a pulse, the power of the pulse increases in the decrease of the pulse duration, the problem significance increases with the decreasing laser-pulse duration. The problems occur significant even with the nano-second-pulse lasers, although they are not applied as such in cold ablation methods.

The pulse duration decrease further to femto or even to atto-second scale makes the problem almost irresolvable. For example, in a pico-second laser system with a pulse duration of 10-15 ps the pulse energy should be 5 µJ for a 10-30 µm spot, when the total power of the laser is 100 W and the repetition rate 20 MHz. Such a fibre to tolerate such a pulse is not available at the priority date of the current application according to the knowledge of the writer at the very date.

The prior art laser treatment systems most often include optical scanners which are based on vibrating mirrors. Such an optical scanner is disclosed in e.g. document DE10343080. A vibrating mirror oscillates between two determined angles relative to an axis which is parallel to the mirror. When a laser beam is directed to the mirror, it is reflected with an angle which depends on the position of the mirror at that moment. The vibrating mirror thus reflects or "scans" the laser beam into points of a line at the surface of a target material.

Figure 1A:
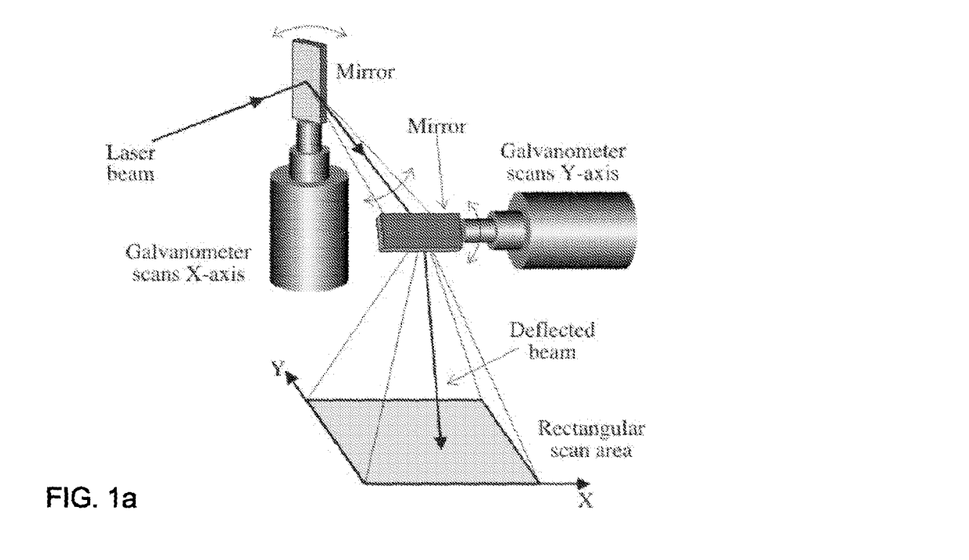
FIG. 1a illustrates an exemplary galvano-scanner set-up employed in state of the art cold ablation coating/thin-film production and in machining and other work-related applications.

An example of a vibrating scanner or "galvano-scanner" is illustrated in FIG. 1a. It has two vibrating mirrors, one of which scans the beam relative to X-axis and another scans the beam relative to orthogonal y-axis.

The production rate is directly proportional to the repetition rate or repetition frequency. On one hand the known mirror-film scanners (galvano-scanners or back and worth wobbling type of scanners), which do their duty cycle in a way characterized by their back and forth movement, the stopping of the mirror at the both ends of the duty cycle is somewhat problematic as well as the accelerating and decelerating related to the turning point and the related momentary stop, which all limit the utilizability of the mirror as scanner, but especially also to the scanning width. The present coating methods employing galvano-scanners can produce scanning widths at most 10 cm, preferably less. If the production rate were tried to be scaled up, by increasing the repetition rate, the acceleration and deceleration cause either a narrow scanning range, or uneven distribution of the radiation and thus the plasma at the target when radiation hit the target via accelerating and/or decelerating mirror.

Figure 1B:
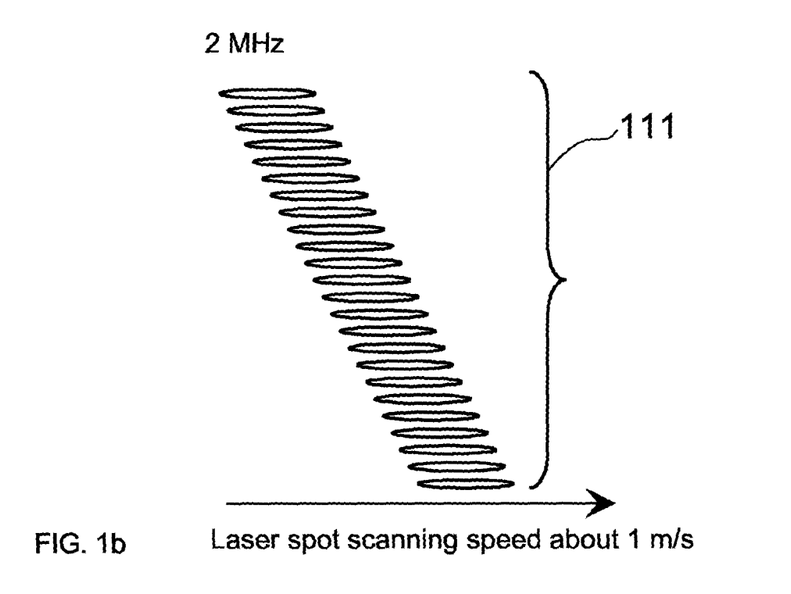
FIG. 1b illustrates the situation wherein prior art galvanometric scanner is employed in scanning laser beam resulting in heavy overlapping of pulses with repetition rate of 2 Mhz.

Conventionally galvanometric scanners are used to scan a laser beam with a typical maximum speed of about 2-3 m/s, in practice about 1 m/s. If trying to increase the coating/thin film production rate by simply increasing the pulse repetition rate, the present above mentioned known scanners direct the pulses to overlapping spot of the target area already at the low pulse repetition rates in kHz-range, in an uncontrolled way. With repetition rate of 2 MHz even 40-60 successive pulses are overlapping. The overlapping of spots 111 in such a situation are illustrated in FIG. 1b.

At worst, such an approach results in release of particles from the target material, instead of plasma but at least in particle formation into plasma. Once several successive laser pulses are directed into the same location of target surface, the cumulative effect seems to erode the target material unevenly and can lead to heating of the target material, the advantages of cold ablation being thus lost.

The same problems apply to nanosecond range lasers, the problem being naturally even more severe because of the long lasting pulse with high energy. Here, the target material heating occurs always, the target material temperature being elevated to approximately 5000 K. Thus, even one single nanosecond range pulse erodes the target material drastically, with aforesaid problems.

In the known techniques, the target may not only ware out unevenly but may also fragment easily and degrade the plasma quality. Thus, the surface to be coated with such plasma also suffers the detrimental effects of the plasma. The surface may comprise fragments, plasma may be not evenly distributed to form such a coating etc. which are problematic in accuracy demanding application, but may be not problematic, with paint or pigment for instance, provided that the defects keep below the detection limit of the very application.

The present methods ware out the target in a single use so that same target is not available for a further use from the same surface again. The problem has been tackled by utilising only a virgin surface of the target, by moving target material and/or the beam spot accordingly.

In machining or work-related applications the left-overs or the debris comprising some fragments also can make the cut-line un even and thus inappropriate, as the case could for instance in flow-control drillings. Also the surface could be formed to have a random bumpy appearance caused by the released fragments, which may be not appropriate in manufacturing of semiconductors.

In addition, the mirror-film scanners moving back and forth generate inertial forces that load the structure it self, but also to the bearings to which the mirror is attached and/or which cause the mirror movement. Such inertia little by little may loosen the attachment of the mirror, especially if such mirror were working nearly at the extreme range of the possible operational settings, and may lead to roaming of the settings in long time scale, which may be seen from uneven repeatability of the product quality. Because of the stoppings, as well as the direction and the related velocity changes of the movement, such a mirror-film scanner has a very limited scanning width so to be used for ablation and plasma production. The effective duty cycle is relatively short to the whole cycle, although the operation is anyway quite slow. In the point of view of increasing the productivity of a system utilising mirror-film scanners, the plasma making rate is in prerequisite slow, scanning width narrow, operation unstable for long time period scales, but yield also a very high probability to get involved with unwanted particle emission in to the plasma, and consequently to the products that are involved with the plasma via the machinery and/or coating.

Neither recent high-technological coating methods, nor present coating techniques related to laser ablation either in nanosecond or cold ablation range (pico-, femto-second lasers) can provide any feasible method for industrial scale products comprising larger surfaces. The present CVD- and PVD-coating technologies require high-vacuum conditions making the coating process batch wise, thus non-feasible for industrial scale production of semiconductors. Moreover, the distance between the material to be coated and the coating material to be ablated is long, typically over 50 cm, making the coating chambers large and vacuum pumping periods time- and energy-consuming. Such high-volume vacuumed chambers are also easily contaminated with coating materials in the coating process itself, requiring continuous and time-consuming cleaning processes.

While trying to increase the production rate in present laser-assisted coating methods, various defects such as short circuiting defect factors, pinholes, increased surface roughness, decreased or disappearing optical transparency in optical implementations, particulates on layer surface, particulates in surface structure affecting corrosion pathways, decreased surface uniformity, decreased adhesion, etc. take place.

Figure 2A:
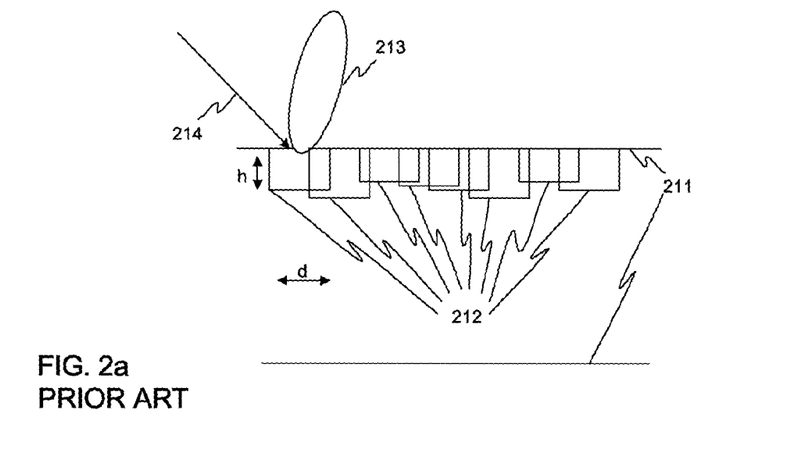
FIG. 2a illustrates plasma-related problems of known techniques.
Figure 2B:
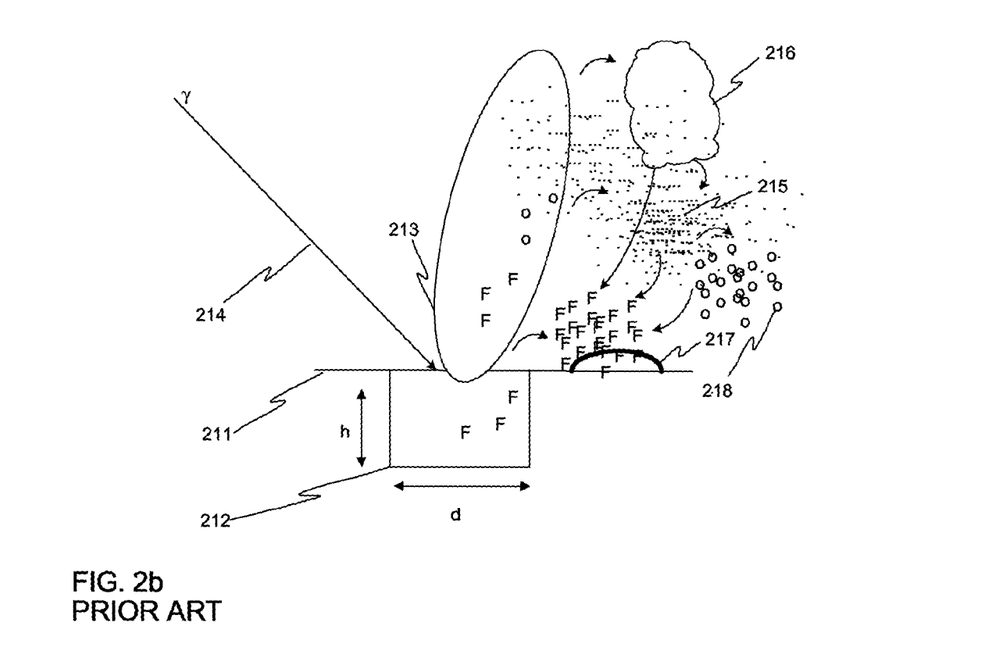
FIG. 2b illustrates further plasma-related problems of known techniques.

Plasma related quality problems are demonstrated in FIGS. 2a and 2b, which indicate plasma generation according to known techniques. A laser pulse 214 hits a target surface 211. As the pulse is a long pulse, the depth h and the beam diameter d are of the same magnitude, as the heat of the pulse 214 also heat the surface at the hit spot area, but also beneath the surface 211 in deeper than the depth h. The structure experiences thermal shock and tensions are building, which while breaking, produce fragments illustrated F. As the plasma may be in the example quite poor in quality, there appears to be also molecules and clusters of them indicate by the small dots 215, as in the relation to the reference by the numeral 215 for the nuclei or clusters of similar structures, as formed from the gases 216 demonstrated in the FIG. 2b. The letter "o"s demonstrate particles that can form and grow from the gases and/or via agglomeration. The released fragments may also grow by condensation and/or agglomeration, which is indicated by the curved arrows from the dots to Fs and from the os to the Fs. Curved arrows indicate also phase transitions from plasma 213 to gas 216 and further to particles 215 and increased particles 217 in size. As the ablation plume in FIG. 2b can comprise fragments F as well as particles built of the vapours and gases, because of the bad plasma production, the plasma is not continuous as plasma region, and thus variation of the quality may be met within a single pulse plume. Because of defects in composition and/or structure beneath the deepness h as well as the resulting variations of the deepness (FIG. 2a), the target surface 211 in FIG. 2b is not any more available for a further ablations, and the target is wasted, although there were some material available.

SUMMARY OF THE INVENTION

An object of the present invention is to provide semiconductors, as well as an arrangement and method of their production, wherein the described disadvantages of the prior art are avoided or reduced.

The object of the invention is therefore to provide a technology for producing layers for semiconductors with certain surface by pulsed laser deposition that so that the uniform surface area to be coated comprises at least 0.2 dm$^2$.

A second object of this invention is to provide new semiconductor products wherein layers are produced by pulsed laser deposition so that the uniform surface area of the layer comprises an area of at least at least 0.2 dm$^2$.

A third object of this invention is to solve a problem how to provide available such fine plasma practically from a target to be used in semiconductor products, so that the target material do not form into the plasma any particulate fragments either at all, i.e. the plasma is pure plasma, or the fragments, if exist, are rare and at least smaller in size than the ablation depth to which the plasma is generated by ablation from said target.

A fourth object of the invention is to provide at least a new method and/or related means to solve how to provide the uniform surface area of a layer in a semiconductor product with the high quality plasma without particulate fragments larger in size than the ablation depth to which the plasma is generated by ablation from said target, i.e. to coat substrates with pure plasma.

A fifth object of this invention is to is to provide a good adhesion of the coating to the uniform surface area by said pure plasma, so that wasting the kinetic energy to particulate fragments is suppressed by limiting the existence of the particulate fragments or their size smaller than said ablation depth. Simultaneously, the particulate fragments because of their lacking existence in significant manner, they do not form cool surfaces that could influence on the homogeneity of the plasma plume via nucleation and condensation related phenomena.

A sixth object of the invention is to provide at least a new method and/or related means to solve a problem how to provide a broad scanning width simultaneously with fine plasma quality and broad coating width even for large semiconductor bodies in industrial manner.

A seventh object of the invention is to provide at least a new method and/or related means to solve a problem how to provide a high repetition rate to be used to provide industrial scale applications in accordance with the objects of the invention mentioned above.

An eighth object of the invention is to provide at least a new method and/or related means to solve a problem how to provide good quality plasma for providing layers/surfaces to manufacture semiconductor products according to the first to seven objects, but still save target material to be used in the deposition phases producing same quality coatings/thin films where needed.

A further object of the invention is to use such method and means according previous objects to solve a problem how to cold-work and/or produce layers of a semiconductor.

The present invention is based on the surprising discovery that layers for semiconductor products comprising large surfaces can be produced with industrial production rates and excellent qualities regarding one or more of technical features such as optical transparency, chemical and/or wear resistance, scratch-free-properties, thermal resistance and/or conductivity, resistivity, coating adhesion, particulate-free coatings, pinhole-free coatings and electronic conductivity by employing ultra short pulsed laser deposition in a manner wherein pulsed laser beam is scanned with a rotating optical scanner comprising at least one mirror for reflecting said laser beam. Moreover, the present method accomplishes the economical use of target materials, because they are ablated in a manner accomplishing the reuse of already subjected material with retained high coating results. The present invention further accomplishes the producing of product layers in low vacuum conditions with simultaneously high coating properties. Moreover, the required coating chamber volumes are dramatically smaller than in competing methods. Such features decrease dramatically the overall equipment cost and increase the coating production rate. In many preferable cases, the coating equipment can be fitted into production-line in online manner.

More specifically, the object of the invention is achieved by providing a method for producing by laser ablation at least one layer having a surface and to be used as part of a semiconductor, which is characterized in that the surface area to be produced comprises at least an area 0.2 dm$^2$ and the coating is performed by employing ultra short pulsed laser deposition wherein pulsed laser beam is scanned with a rotating optical scanner comprising at least one mirror for reflecting said laser beam.

The invention also relates to a semiconductor comprising at least one layer with a surface, produced by laser ablation, which is characterized in that the uniform surface area to be produced comprises at least an area 0.2 dm$^2$ and the layer has been produced by employing ultra short pulsed laser deposition wherein pulsed laser beam is scanned with a rotating optical scanner comprising at least one mirror for reflecting said laser beam.

Some embodiments of the invention are described in dependent claims.

In this patent application term "light" means any electromagnetic radiation which can be used for cold ablation and "laser" means light which is coherent or a light source producing such light. "Light" or "laser" is thus not restricted in any way to the visible part of the light spectrum.

In this patent application term "ultra short pulse laser deposition" means that a certain point at the target surface is radiated with a laser beam for a time period of less than 1 ns, preferably less than 100 ps at a time. Such an exposure may be repeated at the same location of the target.

In this patent application term "coating" means forming material layer of any thickness on a substrate. Coating thus may also mean producing thin films with a thickness of e.g. <1 μm.

In this patent application term "surface" may mean surface of a layer, coating and/or, wherein the surface may be an outer surface or it may form an interface with other layer/coating/substrate. The surface may also be a surface of a half-finished product, which may be further processed to achieve a final product.

BRIEF DESCRIPTION OF THE DRAWINGS

The described and other advantages of the invention will become apparent from the following detailed description and by referring to the drawings where:

FIG. 6b illustrates the movement of the ablating beam achieved by each mirror in the example of FIG. 6a.

FIG. 10b illustrates an exemplary part of target material of FIG. 10a.

DETAILED DESCRIPTION

FIGS. 1a, 1b, 2a and 2b where already described above in the prior art description.

Figure 3:
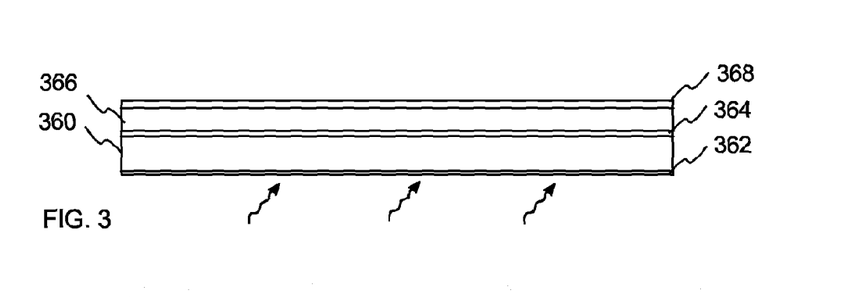
FIG. 3 illustrates exemplary layers produced for a semiconductor.
Figure 12:
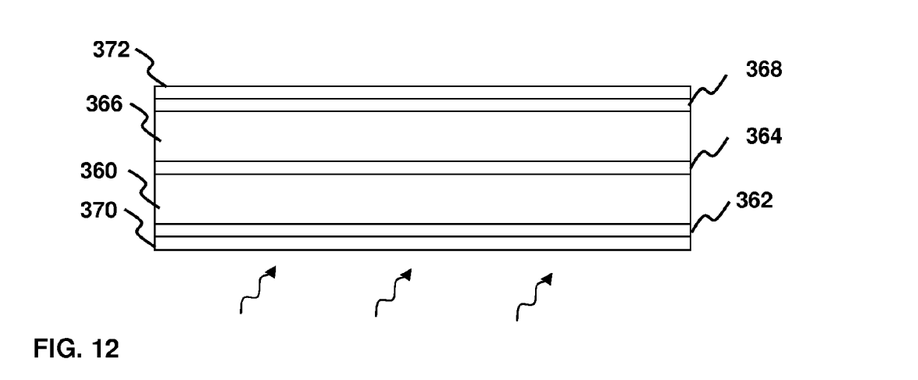
FIG. 12 illustrates exemplary layers produced for a semiconductor of FIG. 3 with multilayers.

FIGS. 3 and 12 illustrate exemplary layers of a semiconductor, which is based on film layer technology. The substrate 360 may be e.g. glass or plastic material or even fiber material, and the substrate material may also be flexible. In an optical circuitry such as a display there may be an antireflection layer 362. There may also be other or additional layers 370 for keeping the outer surface clean and protected from environmental stresses. At the inner surface of the substrate 360 there is an electrically conducting layer 364 which may be patterned according to the circuit layout and partitioning of the semiconductor. The conducting layer may transparent depending on the application. Next, above the conductive layer, there is one or several semiconducting layers 366. Finally, there is another conductive layer 368 for providing further wiring. There may also be an additional, protecting layer 372 at the surface of the second conductive layer.

If a semiconductor would be produced with a semiconducting substrate, there exists similar layers in similar order, but the production is implemented by starting with a semiconducting substrate and producing other layers on that substrate.

Figure 4:
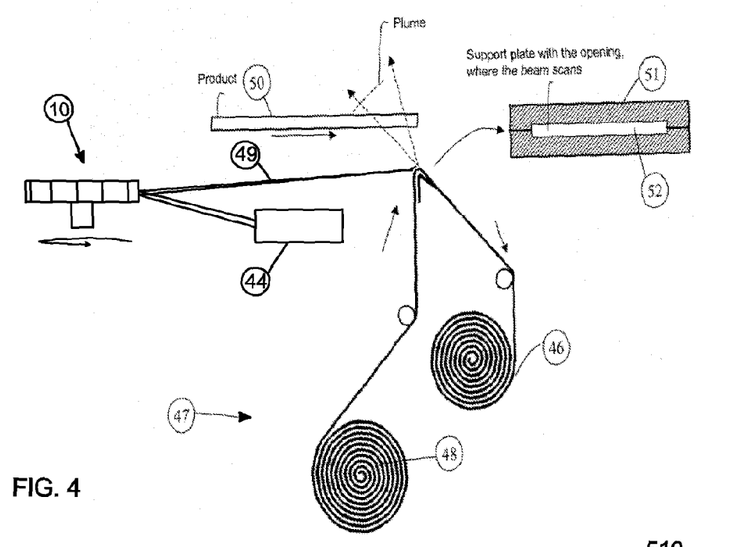
FIG. 4 illustrates an exemplary arrangement according to the invention for producing a layer for a semiconductor using pulsed laser technology.

FIG. 4 illustrates an exemplary system for treating material with laser ablation. A laser beam formed by a laser source 44 and scanned with a rotating optical scanner 10 towards the target. The target 47 has a form of a band which is spooled from a feed roll 48 into a discharge roll 46. The target is supported with a support plate 51 which has an opening 52 at the location of ablation. However, the target may alternatively be other than band, such as a rotating cylinder of target material. When the laser beam 49 received from the scanner hits the target, material is ablated, and a plasma plume is provided. A substrate 50 is provided into the plasma plume. The substrate will thus be coated with a layer of target material. If a layer is to be machined after the deposition, this can be made with a laser beam.

It is also to possible to provide the laser ablation with many other alternative structures and arrangements. For example, it is naturally possible to provide the deposition from under or above the substrate or both. It is also possible to use target material which is provided on a transparent sheet. In such an arrangement it is possible to provide the target material very close to the substrate and to provide the laser beam to the target material through the transparent part of the sheet. If the target material is a thin film at the sheet, it will ablate towards the substrate. The target sheet can be first produced by ablating the target material on a transparent sheet.

Figure 5:
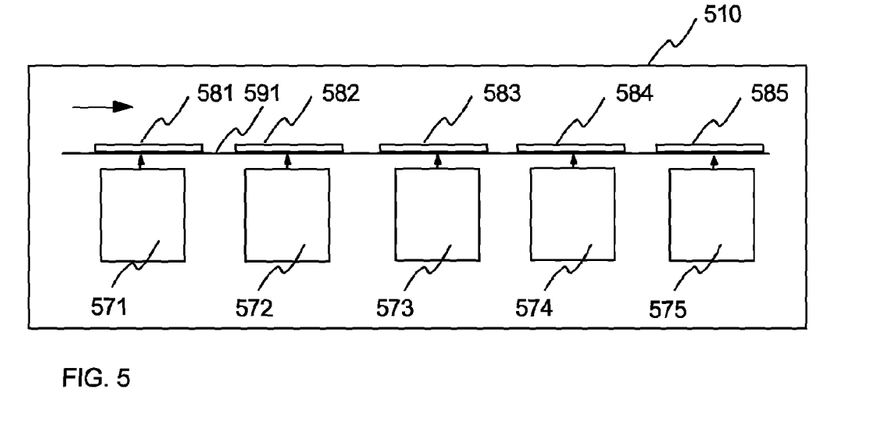
FIG. 5 illustrates an exemplary arrangement according to the invention for producing several layers of a semiconductor using pulsed laser technology.

FIG. 5 illustrates an exemplary production line arrangement for producing layers for a semiconductor. The arrangement includes five laser processing units 571-575 within a same processing chamber 510. Above the processing unit there is a conveyor 591 for transferring substrates 581-585 along the line. Each processing unit provides a certain process for the substrate. The processing units may produce layers or they may provide laser machining of the substrate or produced layers. Naturally, there may also be other types of processing units within the production line. It is an important advantage of the invention that layers of different materials can be deposited within a same chamber on the same production line. It is even possible to provide possibly required laser patterning. When all or most of the layers are produced in the same chamber, the risk of contamination or other defects due to handling of semi-finished products is minimal.

Next, the physical basis and structure of suitable rotating scanners is described.

According to the invention there is provided a method for providing a layer for a semiconductor with a certain surface by laser ablation in which method the surface area to be coated comprises at least 0.2 dm$^2$ and the depositing is carried by employing ultra short pulsed laser deposition wherein pulsed laser beam is scanned with a rotating optical scanner comprising at least one mirror for reflecting said laser beam.

Ultra Short Laser Pulsed Deposition is often shortened USPLD. Said deposition is also called cold ablation, in which one of the characteristic features is that opposite for example to competing nanosecond lasers, practically no heat transfer takes place from the exposed target area to the surroundings of this area, the laser pulse energies being still enough to exceed ablation threshold of target material. The pulse lengths are typically under 50 ps, such as 5-30 ps. i.e. ultra short, the phenomena of cold ablation being reached with pico-second but also femto-second and atto-second pulsed lasers. The material evaporated from the target by laser ablation is deposited onto a substrate that can be held near room temperature. Still, the plasma temperature reaches 1,000,000 K on exposed target area. The plasma speed is superior, gaining 100,000 m/s and thus, leading to better adhesion of coating/thin-film produced. In a more preferred embodiment of the invention, said uniform surface area comprises at least 0.5 dm$^2$. In a still more preferred embodiment of the invention, said uniform surface area comprises at least 1.0 dm$^2$. The invention accomplishes easily also the coating of products comprising uniform coated surface areas larger than 0.5 m$^2$, such as 1 m$^2$ and over. The process is especially beneficial for coating large surfaces of layers for semiconductors with high quality plasma.

In industrial applications, it is important to achieve high efficiency of laser treatment. In cold ablation, the intensity of laser pulses must exceed a predetermined threshold value in order to facilitate the cold ablation phenomenon. This threshold value depends on the target material. In order to achieve high treatment efficiency and thus, industrial productivity, the repetition rate of the pulses should be high, such as 1 MHz, preferably over 2 MHz and more preferably over 5 MHz. As mentioned earlier, it is advantageous not to direct several pulses into same location of the target surface because this causes a cumulating effect in the target material, with particle deposition leading to bad quality plasma and thus, bad quality coatings and thin-films, undesirable eroding of the target material, possible target material heating etc. Therefore, to achieve a high efficiency of treatment, it is also necessary to have a high scanning speed of the laser beam. According to the invention, the velocity of the beam at the surface of the target should generally be more than 10 m/s to achieve efficient processing, and preferably more than 50 m/s and more preferably more than 100 m/s, even such speeds as 2000 m/s.

Figure 6A:
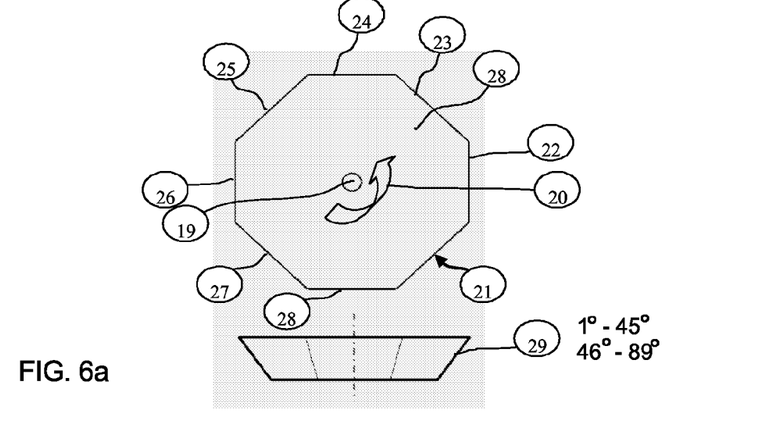
FIG. 6a illustrates one possible turbine scanner mirror employed in a method according to the invention.

FIG. 6a illustrates an example of a rotating turbine scanner, which can be used in implementing the invention. According to this embodiment, rotating optical scanner comprises at least three mirrors for reflecting laser beam. In one embodiment of the invention, in the coating method employs a polygonal prism illustrated in FIG. 5. Here, a polygonal prism has faces 21, 22, 23, 24, 25, 26, 27 and 28. Arrow 20 indicates that the prism can be rotated around its axis 19, which is the symmetry axis of the prism. When the faces of the prism of the FIG. 6a are mirror faces, advantageously oblique in order to achieve scanning line, arranged such that each face in its turn will change, by means of reflection, the direction of radiation incident on the mirror surface as the prism is rotated around its axis, the prism is applicable in the method according to an embodiment of the invention, in its radiation transmission line, as part of a rotating scanner, i.e. turbine scanner. FIG. 6a shows 8 faces, but there may be considerably more faces than that, even dozens or hundreds of them. FIG. 6a also shows that the mirrors are at the same oblique angle to the axis, but especially in an embodiment including several mirrors, the said angle may vary in steps so that, by means of stepping within a certain range, a certain stepped shift on the work spot is achieved on the target, illustrated in FIG. 6b. The different embodiments of invention are not to be limited into various turbine scanner mirror arrangements regarding for example the size, shape and number of laser beam reflecting mirrors.

Figure 6B:
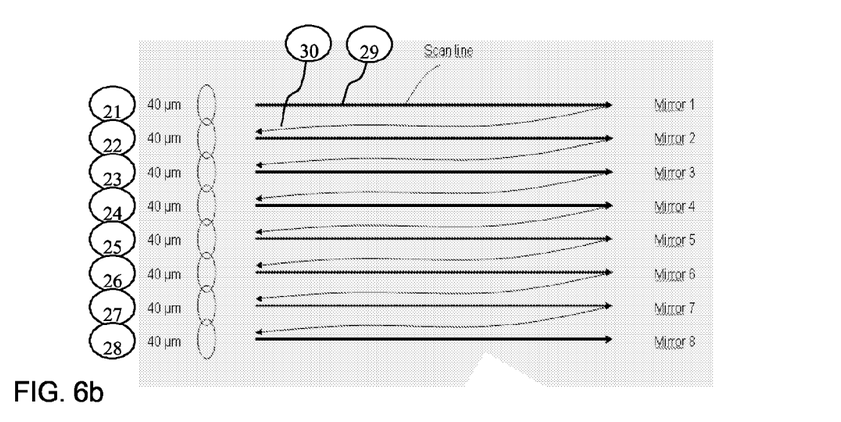
Figure 7:
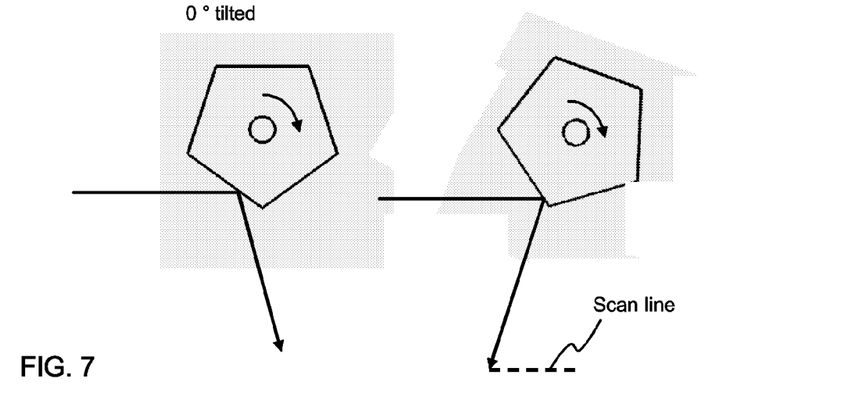
FIG. 7 illustrates beam guidance through one possible rotating scanner to be employed according to the invention.
Figure 8A:
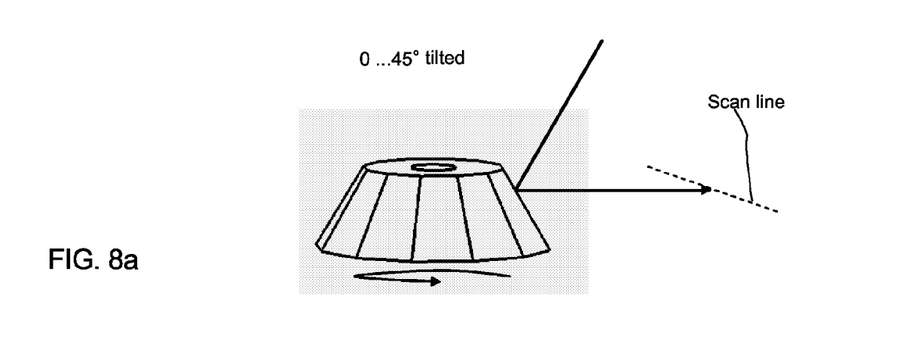
FIG. 8a illustrates beam guidance through another possible rotating scanner to be employed according to the invention.
Figure 8B:
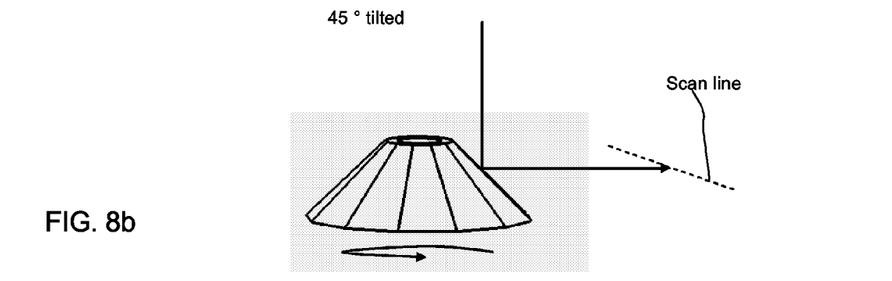
FIG. 8b illustrates beam guidance through a further possible rotating scanner to be employed according to the invention.

The structure of the turbine scanner, FIG. 6a, includes at least 2 mirrors, preferably more than 6 mirrors, e.g. 8 mirrors (21 to 28) positioned symmetrically around the central axis 19. As the prism 21 in the turbine scanner rotates 20 around the central axis 19, the mirrors direct the radiation, a laser beam, for instance, reflected from spot 29, accurately onto the line-shaped area, always starting from one and the same direction (FIG. 6b). The mirror structure of the turbine scanner may be non-tilted (FIG. 7) or tilted at a desired angle, e.g. FIGS. 8a and 8b. The size and proportions of the turbine scanner can be freely chosen. In one advantageous embodiment of the coating method it has a perimeter of 30 cm, diameter of 12 cm, and a height of 5 cm.

In an embodiment of the invention it is advantageous that the mirrors 21 to 28 of the turbine scanner are preferably positioned at oblique angles to the central axis 19, because then the laser beam is easily conducted into the scanner system.

In a turbine scanner according to be employed according to an embodiment of the invention (FIG. 6a) the mirrors 21 to 28 can deviate from each other in such a manner that during one round of rotational movement there are scanned as many line-shaped areas (FIG. 6b) 29 as there are mirrors 21 to 28.

Figure 9:
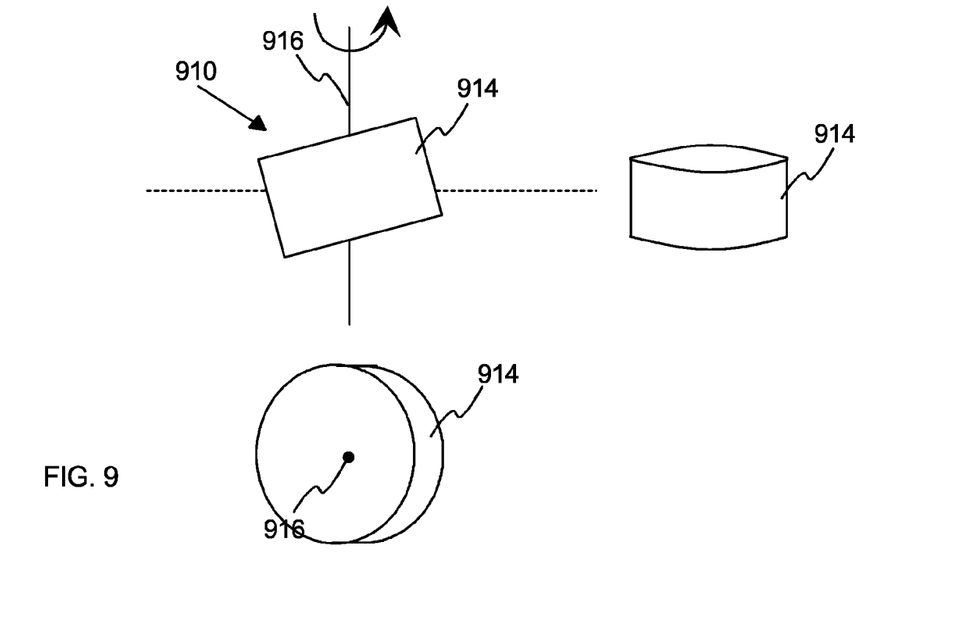
FIG. 9 illustrates the side view and the end view of the mirror.

According to one embodiment of the invention, rotating optical is here meant scanners comprising at least one mirror for reflecting laser beam. Such a scanner and its applications are described in patent application FI20065867. FIG. 9 illustrates a scanner 910 with one rotating mirror. The mirror 914 is arranged to rotate around the axis of rotation 916. FIG. 9 also shows the side view and the end view of the mirror. The mirror has a shape of a cylinder, which is slightly tilted in relation to the axis of rotation 916. The mirror is shown as a tilted cylinder in order to better visualize the form of the mirror, and the ends of the mirror are therefore oblique. However, it would also be possible to have edges which are perpendicular to the axis of rotation. The optical scanner has an axle at the axis of rotation, in which the mirror is connected. The mirror may be connected to the rotating axle with e.g. end plates or spokes (not shown in the Figure).

Figure 10A:
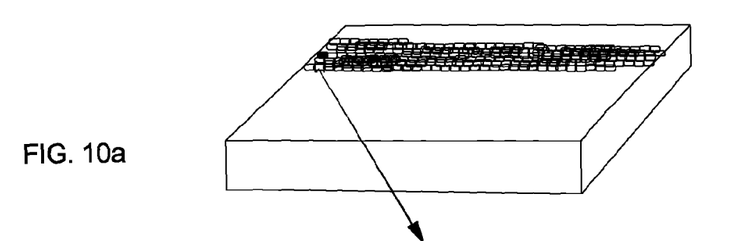
FIG. 10a illustrates an embodiment according to the invention, wherein target material ablated by scanning the laser beam with rotating scanner (turbine scanner).
Figure 10B:
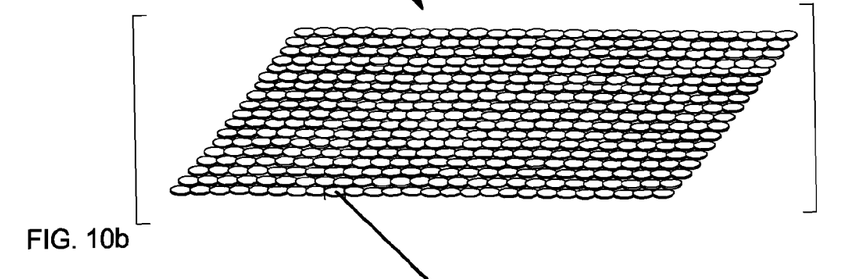
Figure 10C:
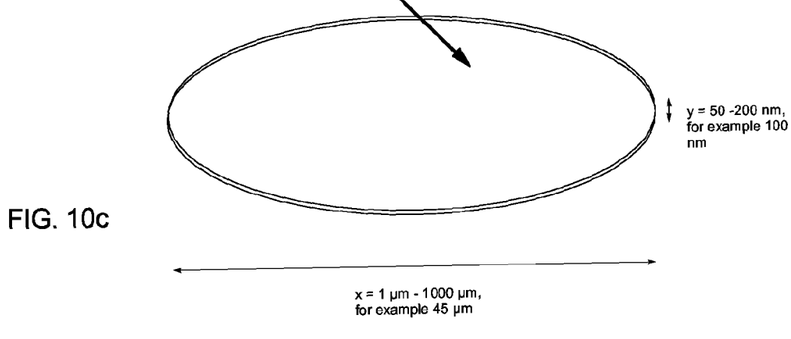
FIG. 10c illustrates an exemplary ablated spot of target material of FIG. 110b.

FIG. 10a demonstrates a target material ablated with pico-second-range pulsed laser employing rotating scanner with speed accomplishing the ablation of target material with slight overlapping of adjacent pulses, avoiding the problems associated with prior art galvano-scanners. FIG. 10b shows enlarged picture of one part of the ablated material, clearly demonstrating the smooth and controlled ablation of material on both x- and y-axis and thus, generation of high quality, particle-free plasma and further, high quality thin-films and coatings. FIG. 10c demonstrates one example of possible x- and y-dimensions of one single ablation spot achieved by one or few pulses. Here, it can be clearly seen, that the invention accomplishes the ablation of material in a manner wherein the width of the ablated spot is always much bigger than the depth of the ablated spot area. Theoretically, the possible particles (if they would be generated) could now have a maximum size of the spot depth. The rotating scanner now accomplishes the production of good quality, particle free plasma with great production rate, with simultaneously large scanning width, especially beneficial for substrates comprising large surface areas to be coated. Furthermore, the FIGS. 10a, 10b and 10c clearly demonstrate that opposite to present techniques, the already ablated target material area can be ablated for new generation of high class plasma—reducing thus radically the overall coating/thin-film producing cost.

Figure 11:
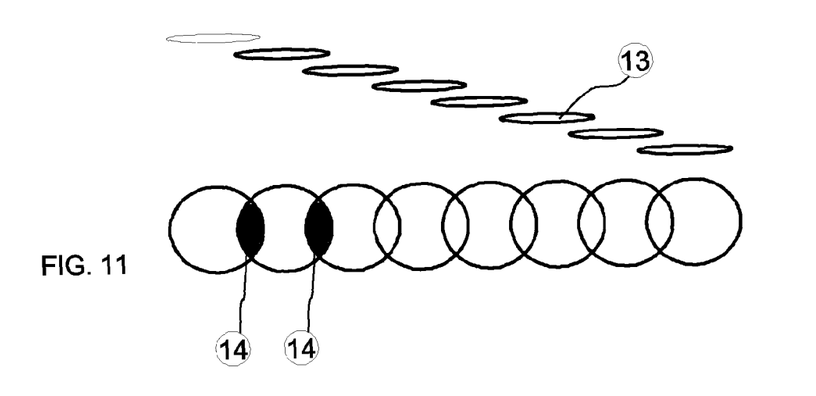
FIG. 11 illustrates an exemplary way according to the invention to scan and ablate target material with a rotating scanner.

FIG. 11 demonstrates an example wherein coating is carried out by employing a pico-second USPLD-laser and scanning the laser pulses with turbine scanner. Here, the scanning speed is 30 m/s, the laser spot-width being 30 µm. In this example, there is ⅓ overlapping between the adjacent pulses.

Next some materials are described which are suitable as target materials for providing layers of the semiconductor. A layer of conductive transparent material can be made of e.g. indium tin oxide, aluminum doped zinc oxide, tin oxide or fluorine-doped tin oxide. The layer of conductive non-transparent material can be made of e.g. aluminum, copper or silver. The layer of semiconducting material can be made of e.g. silicon, germanium indium tin oxide, aluminum doped zinc oxide, tin oxide or fluorine-doped tin oxide. The layer of antireflective coating can be made of e.g. of silicon nitride or titanium oxide. However, these are just some examples of commonly used materials. Next, some further alternatives are discussed in more detail.

Advantageous metal oxides include for example aluminum oxide and its different composites such as aluminum titan oxide (ATO). Due to its resistivity, high-optical transparencies possessing high-quality indium tin oxide (ITO) is especially preferred in applications wherein the coating can be employed to warm-up the coated surface. It can also be employed in solar-control Yttrium stabilized zirconium oxide is another example of different oxides possessing both excellent optical, wear-resistant properties.

Some further metals can also be applied in semiconductor applications. Here, the optical properties of metal-derived thin-films are somewhat different from those of bulk metals. In ultrathin films (<100 Å thick) variations make the concept of optical constants problematic, the quality and surface roughness of the coating (thin film) being thus critical technical features. Such coatings can easily be produced with the method of present invention.

Dielectric materials employed in present applications include fluorides (e.g. $MgF_2$, $CeF_3$), oxides (e.g. $Al_2O_3$, $TiO_2$, $SiO_2$), sulfides (e.g. ZnS, CdS) and assorted compounds such as ZnSe and ZnTe. An essential common feature of dielectric optical materials in their very low absorption ($\alpha < 10^3$/cm) in some relevant portion of the spectrum; in this region they are essentially transparent (e.g. fluorides and oxides in the visible and infrared, chalcogenides in the infrared). Dielectric coatings can be advantageously produced with the method of present invention.

Transparent conducting films may consist either of very thin metals or semiconducting oxides and/and most presently even nitrides such as indium gallium nitride in front electrodes for semiconductors.

Metals that have conventionally been employed be as transparent conductors include Au, Pt, Rh, Ag, Cu, Fe and Ni. Simultaneous optimization of conductivity and transparency presents a considerable challenge in film deposition. At one extreme are discontinuous islands of considerable transparency but high resistivity; at the other are films that coalesce early and are continuous, possessing high conductivity but low transparency. For these reasons, the semi-conducting oxides such as $SnO_2$, $In_2O_3$, CdO, and, more commonly, their alloys (e.g. ITO), doped $In_2O_3$ (with Sn, Sb) and doped $SnO_2$ (with F, Cl, etc.) are used.

The metal oxide coatings can be produced by either ablating metal or metals in active oxygen atmosphere or by ablating oxide-materials. Even in latter possibility, it is possible to enhance the coating quality and/or production rate by conducting the ablation in reactive oxygen. When producing nitrides it is according to the invention possible to use nitrogen atmosphere or liquid ammonia in order to enhance the coating quality. A representative example of invention is production of carbon nitride ($C_3N_4$ films).

According another embodiment of the invention, said uniform surface area of semiconductor layer is produced with carbon material comprising over 90 atomic-% of carbon, with more than 70% of $sp^3$-bonding. Such materials include for example amorphous diamond, nano-crystalline diamond or even pseudo-monocrystalline diamond. Various diamond coatings give excellent tribological, wear- and scratch-free properties but increase also the heat-conductivity and—resistance. Diamond-coatings on glass can be used with special preference in semiconductors, if of high quality, i.e. crystalline form.

In a still another embodiment of the invention, said uniform surface area of may be produced of material comprising carbon, nitrogen and/or boron in different ratios. Such materials include boron carbon nitride, carbon nitride (both $C_2N_2$ and $C_3N_4$), boron nitride, boron carbide or phases of different hybridizations of B—N, B—C and C—N phases. Said materials are diamond-like materials having low densities, are extremely wear-resistant, and are generally chemically inert. For example carbon nitrides can be employed to protect semiconductor products against corrosive conditions, as coatings in semiconductors.

Further possible materials include Indium gallium nitride, copper indium gallium selenide, silicon oxide, 6H silicon carbide (hexagonal) and cadmium telluride.

It should also be noted that it is possible to provide a semiconducting layer/surface by ablating at least two different materials. One of the materials may be a dopant.

According to one embodiment of invention, the outer surface of the semiconductor product is coated with only one single coating. According to another embodiment of the invention, said uniform surface of the semiconductor is coated with multilayered coating. Several coatings can be produced in for different reasons. Additionally, the multilayered coating can possess several functions not achievable without said structure. The present invention accomplishes the production of several coatings in one single coating chamber or in the adjacent chambers.

The present invention further accomplishes the production of composite layers/coatings to semiconductors ablating simultaneously one composite material target or two or more target materials comprising one or more substances.

A suitable thickness of an ablated layer is e.g. between 20 nm and 20 µm, preferably between 100 nm and 5 µm. The coating thicknesses must not be limited to those, because the present invention accomplishes the preparation of molecular scale coatings on the other hand, very thick coatings such as 100 µm and over, on the other hand.

According to the invention there may also provided a semiconductor product comprising a certain surface being coated by laser ablation wherein the coated uniform surface area comprises at least 0.2 dm$^2$ and that the coating has been carried by employing ultra short pulsed laser deposition wherein pulsed laser beam is scanned with a rotating optical scanner comprising at least one mirror for reflecting said laser beam. The benefits received with these products are described in more detail in the previous description of the method.

In a more preferred embodiment of the invention said uniform surface area comprises at least 0.5 dm$^2$. In a still more preferable embodiment of the invention said uniform surface area comprises at least 1.0 dm$^2$. The invention accomplishes easily also the products comprising uniform coated surface areas larger than 0.5 m$^2$, such as 1 m$^2$ and over.

According to one embodiment of the invention the average surface roughness of produced coating on said uniform surface area is less than 100 nm as scanned from an area of 100 µm$^2$ with Atomic Force Microscope (AFM).

According to another embodiment of the invention the optical transmission of produced coating on said uniform surface area is no less than 88%, preferably no less than 90% and most preferably no less than 92%. In some cases the optical transparency can exceed 98%.

According to still another embodiment of the invention said uniform surface area is coated in a manner wherein the first 50% of said coating on said uniform surface area does not contain any particles having a diameter exceeding 1000 nm, preferably 100 nm and most preferably 30 nm.

According to one embodiment of the invention said layer comprises metal, metal oxide, metal nitride, metal carbide or mixtures of these. The possible metals were described earlier in description of now invented coating method.

According to another embodiment of the invention said layer of semiconductor product is provided with carbon material comprising over 90 atomic-% of carbon, with more than 70% of $sp^3$-bonding. The possible carbon materials were described earlier in description of now invented coating method.

According to still another embodiment of the invention said uniform surface area comprises carbon, nitrogen and/or boron in different ratios. Such materials were described earlier in description of now invented coating method.

According to still another embodiment of the invention said uniform surface area the product is coated with organic polymer material. Such materials were described earlier in more detail in description of now invented coating method.

According to one preferred embodiment of the invention the thickness of said coating on uniform surface of semiconductor layer is between 20 nm and 20 µm, preferably between 100 nm and 5 µm. The invention accomplishes also layers comprising one or several atomic layer coatings and thick coatings such as exceeding 100 µm, for example 1 mm.

In this patent specification the structure of the other various components of a laser ablation apparatus is not described in more detail as they can be implemented using the description above and the general knowledge of a person skilled in the art.

Above, only some embodiments of the solution according to the invention have been described. The principle according to the invention can naturally be modified within the frame of the scope defined by the claims, for example, by modification of the details of the implementation and ranges of use.

For example, only a few structures of semiconductors have been discussed as examples. There are many other types of other alternative structures, wherein the structure comprises one or several layers of different materials, commonly semiconducting, conductive, insulating and transparent materials. In is naturally possible to use to apply the present invention also in such other types of structures of semiconductors.

Even if it has been discussed on large sized semiconductors, it is natural, that a manufactured large-sized semiconductor can be partitioned into smaller components. It is also possible to make the partitioning by using masks in the ablation process.

The invention claimed is:

1. A method for producing by laser cold ablation at least one layer having a surface and to be utilized as part of a semiconductor, a surface area to be produced having at least an area of 0.2 square decimeters and the coating is performed by:
    employing ultra short pulsed laser deposition wherein a pulsed laser beam is scanned with a rotating optical scanner comprising a plurality of mirrors for reflecting said laser beam, the rotating optical scanner causing the laser beam to scan a surface of the target with a velocity of more than 10 m/s,
    wherein an employed pulse repetition rate of said laser deposition is at least 1 MHz or greater.

2. The method according to claim 1, wherein said surface area is a uniform surface area.

3. The method according to claim 1, wherein said surface area comprises at least 0.5 square decimeters.

4. The method according to claim 1, wherein the surface layer does not comprise short circuiting defect factors.

5. The method according to claim 1, wherein an average surface roughness of produced layer on said uniform surface area is less than 100 nm as scanned from an area of 100 $\mu m^2$ with Atomic Force Microscope (AFM).

6. The method according to claim 1, further comprising the step of providing a layer of conductive transparent material made of indium tin oxide, aluminum doped zinc oxide, tin oxide or fluorine-doped tin oxide.

7. The method according to claim 1, further comprising the step of providing a layer of conductive non-transparent material made of aluminum or copper.

8. The method according to claim 1, wherein the layer of semiconducting material is made of silicon, germanium indium tin oxide, aluminum doped zinc oxide, tin oxide or fluorine-doped tin oxide.

9. The method according to claim 1, further comprising the step of providing a layer of antireflective coating made of silicon nitride or titanium oxide.

10. The method according to claim 1, wherein the layer comprises at least one of following materials or a mixture of these:
    at least 80% metal oxide or composition thereof; or
    carbon, nitrogen and/or boron; or
    carbon material comprising over 90 atomic-% of carbon, with more than 70% of $sp^3$-bonding.

11. The method according to claim 1, further comprising the step of coating an outer surface of said semiconductor with multilayered coating.

12. The method according to claim 1, wherein the thickness of the layer is between 20 nm and 20 μm.

13. A method for producing a layer by laser cold ablation, comprising:
    employing ultra short pulsed laser deposition wherein a pulsed laser beam is scanned with a rotating optical scanner comprising a plurality of mirrors for reflecting said laser beam, the rotating optical scanner causing the laser beam to scan a surface of the target with a velocity of more than 10 m/s, and an employed pulse repetition rate of said laser is at least 1 MHz or greater,
    wherein the layer has a uniform surface with a surface area of at least 0.5 square decimeters.

14. The method according to claim 13, wherein the cold ablation is short pulsed laser deposition with a pulse length of 5-30 ps.

15. The method according to claim 13, wherein material evaporated from a target by cold ablation is deposited on a substrate held near room temperature.

* * * * *